United States Patent
Yamauchi et al.

(10) Patent No.: US 8,547,351 B2
(45) Date of Patent: Oct. 1, 2013

(54) TOUCH SENSOR DEVICE, CONTROL METHOD, TOUCH PANEL DEVICE AND PROGRAM

(75) Inventors: Kazuto Yamauchi, Okazaki (JP); Yasunori Murayama, Ichinomiya (JP); Sadahiko Tanaka, Okazaki (JP); Keitaro Takizawa, Okazaki (JP); Kouichi Yamanoue, Yokohama (JP)

(73) Assignee: Mitsubishi Jidosha Kogyo Kabushiki Kaisha, Kanagawa (JP)

( * ) Notice: Subject to any disclaimer, the term of this patent is extended or adjusted under 35 U.S.C. 154(b) by 725 days.

(21) Appl. No.: 12/745,442

(22) PCT Filed: Dec. 16, 2008

(86) PCT No.: PCT/JP2008/072857
§ 371 (c)(1),
(2), (4) Date: May 28, 2010

(87) PCT Pub. No.: WO2009/090820
PCT Pub. Date: Jul. 23, 2009

(65) Prior Publication Data
US 2010/0258361 A1  Oct. 14, 2010

(30) Foreign Application Priority Data
Jan. 16, 2008 (JP) .................. 2008-007422

(51) Int. Cl.
*G09G 5/00* (2006.01)
(52) U.S. Cl.
USPC ........ 345/173; 345/174; 345/178; 178/18.01; 178/18.06

(58) Field of Classification Search
USPC .................. 345/173–178; 178/18.01–18.09, 178/19.01–19.03
See application file for complete search history.

(56) References Cited

U.S. PATENT DOCUMENTS

| | | | |
|---|---|---|---|
| 7,663,609 B2 * | 2/2010 | Miyata et al. ................. | 345/173 |
| 7,728,823 B2 * | 6/2010 | Lyon et al. .................... | 345/173 |
| 2003/0189552 A1 | 10/2003 | Chuang et al. | |
| 2004/0056845 A1 * | 3/2004 | Harkcom et al. ............. | 345/173 |
| 2008/0018610 A1 * | 1/2008 | Harmon et al. ............... | 345/173 |

FOREIGN PATENT DOCUMENTS

| | | |
|---|---|---|
| JP | 8-22361 A | 1/1996 |
| JP | 2003-316518 A | 11/2003 |
| JP | 2007-72798 A | 3/2007 |

OTHER PUBLICATIONS

Lee, "The art of capacitive touch sensing," http://www.eetimes.com/design/alanog-design/4009622/The-art-of-capacitive-touch-sensing, Mar. 1, 2006, 6 pages.

* cited by examiner

*Primary Examiner* — Kevin M Nguyen
*Assistant Examiner* — Jennifer Nguyen
(74) *Attorney, Agent, or Firm* — Birch, Stewart, Kolasch & Birch, LLP (57) ABSTRACT

A touch sensor device 1 includes a touch sensor 11; an average value calculating means 12 for calculating the average value of output voltages sent out from an output section 111 of the touch sensor 11; a threshold value calculating means 13 for calculating a threshold value based on the average value; and a comparing/determining means 14 for comparing the output voltage with the threshold value and, when determining that the output voltage exceeds the threshold value, outputting a determination signal.

7 Claims, 6 Drawing Sheets

TOUCH SENSOR DEVICE, CONTROL METHOD, TOUCH PANEL DEVICE AND PROGRAM

BACKGROUND OF THE INVENTION

1. Field of the Invention

This invention relates to a touch sensor device, a control method, a touch panel device, and a program.

2. Description of the Related Art

In recent years, touch panels used in various industrial equipment use touch sensors which detect which part of the touch panel a human has touched or contacted. When the human touches or contacts an electrode on the touch panel, the same state as a state in which a capacitor having electrostatic capacity equivalent to that of the human body is connected to the electrode is achieved. Utilizing this phenomenon, the touch sensor detects a change in electrostatic capacity formed between this electrode and ground (earth) as an electrical signal.

In this case, the presence or absence of contact is judged by whether the electrical signal detected has a voltage higher than a threshold value or not. However, this threshold value changes according to the temperature or humidity in the surroundings of the touch sensor. If the threshold value is fixed, therefore, the electrical signal may exceed the threshold value because of a temperature change even in the absence of human contact, thereby resulting in a judgment that there has been contact. Even in the presence of human contact, the electrical signal may be unable to exceed the threshold value, and a judgment may be made that there has been no contact.

To solve such problems, it has been known to provide a touch sensor device with a temperature change detecting means and, when a temperature change is detected, correct a threshold voltage according to this temperature change (see, for example, Patent Document 1).

[Patent Document 1] JP-A-08-22361 (see claim 1 and FIG. 2)

SUMMARY OF THE INVENTION

Problems to be Solved by the Invention

The above-mentioned conventional technologies, however, have required that the temperature change be detected by a physical means, and have needed an additional electronic component, thus causing the problem of a cost increase. With a multi-input circuit equipped with a plurality of touch sensors, there has been the problem of difficulty in setting different threshold values for the respective inputs based on the temperature change.

A challenge to the present invention is to solve the above-described problems of the conventional technologies. It is an object of the present invention to provide a touch sensor device involving few malfunctions, and a touch panel device using the touch sensor device, without inducing a cost increase. Another challenge to the present invention is to solve the above problems of the conventional technologies. It is another object of the present invention to provide a control method, which uses a touch sensor involving few malfunctions, and a program for the control method.

Means for Solving the Problems

The touch sensor device of the present invention comprises: a touch sensor; average value calculating means for calculating an average value of output voltages sent out from an output section of the touch sensor; threshold value calculating means for calculating a threshold value based on the average value; and comparing/determining means for comparing the output voltage with the threshold value and, when determining that the output voltage exceeds the threshold value, outputting a determination signal. According to the present invention, the threshold value can be corrected easily and reliably. Thus, a touch sensor device with few malfunctions can be constructed. Since there is no need to use a physical means anew, moreover, an increase in cost can be suppressed.

The average value calculating means preferably comprises sampling means for sampling the output voltages periodically, and recording the sampled output voltages as output voltage data in a recording section; and calculating means for calculating a moving average value of the output voltages recorded in the recording section, and sending out the calculated moving average value to the threshold value calculating means. As described here, the output voltages are sampled periodically, and the moving average value is calculated from their values. By so doing, an appropriate threshold value can be calculated in response to a mild change in the output voltage due to an environmental change. If the output voltages rapidly increase owing to contact with a dielectric (e.g., human body) for example, the threshold value based on the moving average value does not fluctuate promptly responsive to an abrupt increase in the output voltage. Because, the output voltages are sampled, and the moving average value is calculated from their values. In this case as well, therefore, an appropriate threshold value can be calculated. Upon sampling, moreover, the moving average value of the output voltages can be calculated efficiently.

Preferably, voltage drop detecting means is connected to the output section; and the voltage drop detecting means includes detecting means for outputting a signal indicating a drop in the voltage when detecting that the output voltage has dropped, and recorded data erasing means for erasing the output voltage data in the recording section in accordance with the signal indicating the drop in the voltage. In response to changes in the voltage in the increasing direction, the moving average value is calculated. In response to changes in the voltage in the decreasing direction, the output voltage data in the recording section are erased in accordance with the signal indicating the drop in the voltage, that is, the output voltage data before release of human contact, which become the cause of malfunction, are erased. By this measure, an appropriate threshold value can be calculated newly by the average value calculating means and the threshold value calculating means, and a malfunction can be prevented.

Preferably, the voltage drop detecting means has reset means connected to the detecting means, and in accordance with the signal indicating the drop in the voltage, the reset means resets a counter provided for the sampling means. If a voltage drop is detected, the counter is reset, whereby the average value of the output voltages can be calculated anew from that point in time onwards. Thus, the threshold value can be corrected to an appropriate one.

The control method using a touch sensor, according to the present invention, comprises: an average value calculation step of calculating an average value of output voltages from an output section of the touch sensor; a threshold value calculation step for calculating a threshold value from the calculated average value; and a comparison/determination step for comparing the output voltage with the threshold value and, when determining that the output voltage exceeds the threshold value, sending out a determination signal for deciding on an ON-action of a device. In accordance with the present invention, the threshold value can be corrected easily, so that few malfunctions are caused.

Preferably, the average value calculation step comprises a sampling step of sampling the output voltages periodically, and recording the sampled output voltages as output voltage data in a recording section, and a calculation step of calculating a moving average value of the recorded output voltages. By so performing sampling periodically, the moving average value, i.e., the threshold value, conformed to environmental changes can be obtained efficiently.

Preferably, the control method using a touch sensor further comprises a judgment step of outputting a signal indicating a drop in the output voltage when detecting from the output section that the output voltage has dropped, and a recorded data erasure step of erasing output voltage data recorded in a recording section when the signal indicating the drop in the output voltage has been outputted. If the drop in the output voltage is thus detected, the recorded data recorded in the recording section are erased. By so doing, an unerring threshold value conformed to the surrounding environment can be obtained. As a result, a malfunction can be prevented.

When the signal indicating the drop in the output voltage has been outputted, it is preferred to reset the counter of the sampling means. Upon detection of the drop in the voltage, the counter is reset, whereby the average value of the output voltages can be calculated newly from that point in time onwards. Thus, the threshold value can be corrected to a more appropriate one.

The touch panel device of the present invention is a touch panel device including the above-mentioned touch sensor device, a panel section, and a control section, and is one in which a contact electrode as an input section of the touch sensor device is provided in the panel section, and the comparing/determining means is connected to the control section. Since the touch sensor device with few malfunctions and decreased in cost is used, the touch panel device of the present invention involves few malfunctions and achieves cost reduction.

According to the program of the present invention, procedure for the control method using a touch sensor is described as a program code so as to become executable in a computer. By employing the control method using the touch sensor with few malfunctions, the program of the present invention is minimal in malfunctions.

Effects of the Invention

The present invention exhibits the excellent effect of being able to provide a touch sensor device involving few malfunctions, and a touch panel device using the touch sensor device, without inducing a cost increase. Moreover, the control method using the touch sensor of the present invention, and the program of the present invention having the procedure for the control method described as a program code can correct the threshold value easily and reliably, thus showing the excellent effect of having few malfunctions.

DESCRIPTION OF REFERENCE NUMERALS 1, 2 Touch sensor device
11 Touch sensor
12 Average value calculating means
13 Threshold value calculating means
14 Comparing/determining means
21 Voltage drop detecting means

DETAILED DESCRIPTION OF THE INVENTION

Figure 1:
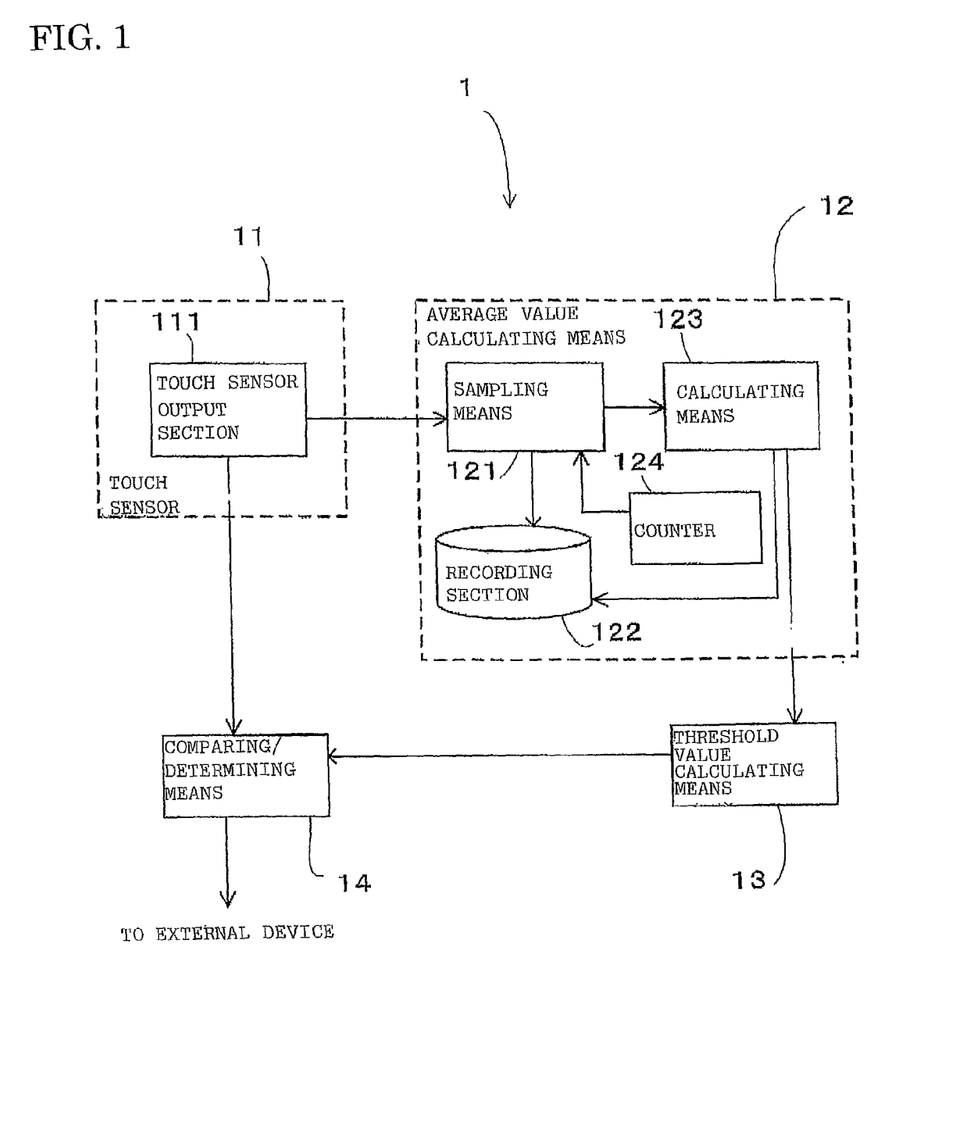
FIG. 1 is a block diagram for illustrating a touch sensor device 1 according to a first embodiment.

A touch sensor device according to a first embodiment will be described using FIG. 1. FIG. 1 is a block diagram showing in outline the configuration of the touch sensor device of the present embodiment. In FIGS. 1 to 6, the same constituent elements are assigned the same numerals.

A touch sensor device 1 of the present embodiment is designed to determine the actions of an external device provided in the touch sensor device. The touch sensor device 1 is equipped with a touch sensor 11, an average value calculating means 12 connected to an output section 111 of the touch sensor 11, a threshold value calculating means 13 connected to the average value calculating means 12, and a comparing/determining means 14 connected to the output section 111 of the touch sensor 11 and the threshold value calculating means 13.

The touch sensor 11 is, for example, a multi-input touch sensor, and has many contact electrodes. Upon contact of a dielectric (e.g., a human body) with any of the contact electrodes, electrostatic capacity formed between this contact electrode and ground (earth) changes. This change is detected as an electrical signal, and outputted from the output section 111. When there is contact with the dielectric, this touch sensor 11 outputs a voltage higher by Vt than a voltage present when there is no contact with the dielectric. Owing to a temperature change or the like, however, its output voltage value is not constant, as stated above.

The average value calculating means 12 records the output voltages outputted from the output section 111, and calculates an average value of the output voltages per predetermined time based on the recorded output voltages.

The threshold value calculating means 13 adds a predetermined value to the value inputted to the threshold value calculating means 13, namely, to the average output voltage value calculated by the average value calculating means 12, thereby calculating a threshold value.

The comparing/determining means 14 compares the output voltage outputted from the output section 111 of the touch sensor 11 with the threshold value obtained by the threshold value calculating means 13, and determines or judges whether the output voltage is higher than the threshold value or not. When the output voltage is higher than the threshold value, the comparing/determining means 14 outputs a signal indicating an ON-state. When the output voltage is lower than the threshold value, the comparing/determining means 14 outputs a signal showing an OFF-state. Such a signal is connected to a control section of an external device (not shown) connected to the comparing/determining means 14 to determine the ON-OFF action of the external device.

The touch sensor 1, configured as above, calculates the average value of the output voltages from the touch sensor 11 by the average value calculating means 12, calculates the threshold value from the average value of the outputs by the threshold value calculating means 13, compares the output voltage from the touch sensor 11 with the threshold value calculated in the threshold value calculating means 13 by the comparing/determining means 14, and outputs the output signal for determining the action of the external device by the comparing/determining means 14.

That is, even if the output characteristics of the touch sensor 11 change according to a temperature change or the like around the touch sensor 11, the touch sensor device 1 of the above-described configuration allows the average value calculating means 12 to obtain the average output voltage per predetermined time in conformity with this change, and can obtain the threshold value based on this average value. Thus, the touch sensor device 1 can correct the threshold value easily. Consequently, even when there is no other physical means such as a temperature change detecting means, the detection sensitivity for contact with the dielectric is high, and malfunction can be prevented.

The average value calculating means 12, concretely, comprises a sampling means 121 connected to the output section 111, a recording section 122 connected to the sampling means 121, a calculating means 123 connected to the sampling means 121 and the recording section 122, and a counter 124 connected to the sampling means 121.

The counter 124 counts periods and, in accordance with these periods, the sampling means 121 samples the output voltages from the output section 111 periodically (for example, at intervals of n seconds such as time t=0, n, 2n, . . . ) and records the sampled output voltages into the recording section 122.

The recording section 122 is able to record each periodically sampled output voltage value as output voltage data.

The calculating means 123 calculates the moving average value, for each predetermined time (N seconds), of the output voltage values recorded in the recording section 122, and outputs the calculated moving average value to the threshold value calculating means 13 connected to the calculating means 123. That is, the calculating means 123 is adapted to calculate the moving average value, per N seconds, of the output voltage data sampled per n seconds and recorded in the recording section 122.

That is, in the average value calculating means 12 of the above-described configuration, the moving average values of the sampled output voltages are discrete values obtained at intervals of the time n. For example, the average value obtained at the time t=0 is outputted to the threshold value calculating means 13 for calculation of the threshold value. Then, during the time t being 0<t<n, the average value, i.e., the threshold value, does not change. At t=n, the threshold value is calculated again based on the average value at the time t=n, and set again. According to these features of the average value calculating means 12, the moving average values are obtained only from the periodically sampled values, so that the average values can be calculated efficiently.

A control method for an external device, which uses the touch sensor device 1 according to the foregoing features, will be described below.

The control method for an external device with the use of the touch sensor device 1 calculates the average of the output voltages from the output section 111 from the touch sensor 11, calculates the threshold value from the calculated average value, and determines the ON-OFF action of the external device, depending on whether the output voltage from the touch sensor is higher than the threshold voltage or not.

Figure 2:
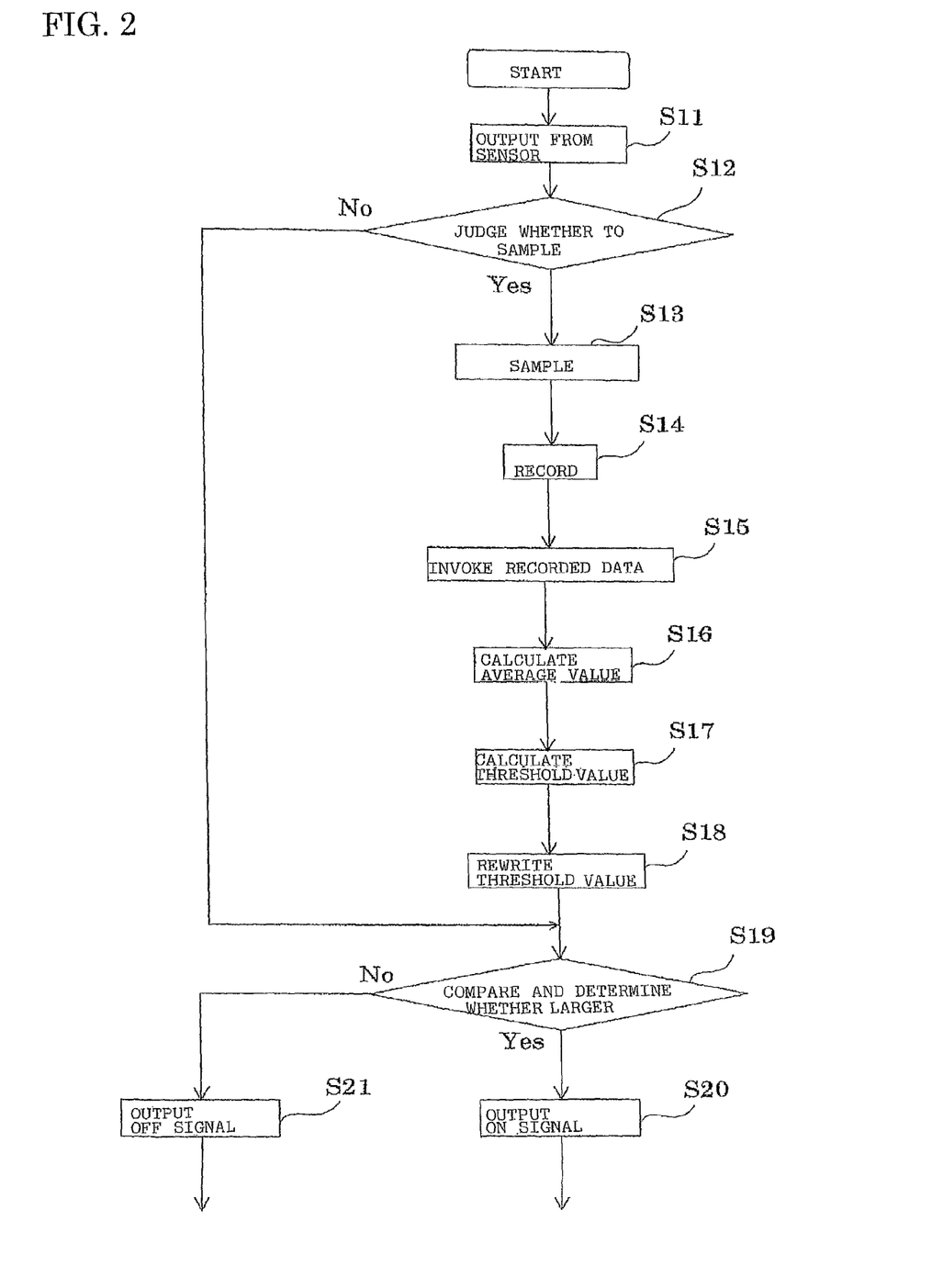
FIG. 2 is a flow chart for illustrating a control method according to the first embodiment.

Using FIG. 2, this control method will be described in detail. FIG. 2 is a flow chart for illustrating the control method for the touch sensor device 1.

As shown in FIG. 2, the output voltage from the output section 111 of the touch sensor 11 is inputted to the average value calculating means 12 at a certain time t=x (sensor output step: S11). Then, the sampling means 121 judges whether the time t=x is the sampling period (t=0, n, 2n, . . . ) or not, namely whether the time corresponds to the timing of sampling or not (sampling judgment step: S12).

If the time t=x corresponds to the timing of sampling, the output voltage value is sampled by the sampling means 121 (sampling step: S13), and recorded in the recording section 122 (recording step: S14). Then, the output voltage data recorded in the recording section 122 is invoked by the calculating means 123 (recorded data invocation step: S15), where the moving average of the output voltage data is calculated (average value calculation step: S16).

Then, based on the moving average value calculated in the average value calculation step, the threshold value is calculated by the threshold value calculating means 13 (threshold value calculation step: S17), and the calculated threshold value is inputted to the comparing/determining means 14. Then, the threshold value recorded in a recording section (not shown) of the comparing/determining means 14 is replaced by the calculated threshold value for rewriting, and recorded there (threshold rewriting step: S18). By this procedure, the calculated threshold value remains unchanged until a next timing of sampling.

Finally, the output voltage from the touch sensor 11 and the threshold value stored in the comparing/determining means 14 are compared, and it is determined whether the output voltage exceeds the threshold value (comparison/determination step: S19). If the output voltage exceeds the threshold value, a signal indicating an ON-action is outputted (ON signal output step: S20), and sent out to the external device. If the output voltage is smaller than the threshold value, a signal indicating an OFF-action is outputted (OFF signal output step: S21), and sent out to the external device.

If the designated time is not the timing of sampling (see the sampling step S12), on the other hand, the output voltage of the touch sensor 11 is inputted to the comparing/determining means 14, where the output voltage is compared with the threshold value inputted to and recorded in the comparing/determining means 14. If the comparison results in the determination that the output voltage is greater, the signal indicating the ON-action is outputted, and delivered to the external device. If the output voltage is found to be lower, the signal indicating the OFF-action is outputted, and delivered to the external device.

The above steps S11 to S21 are repeated to obtain the moving average value of the output voltages for each predetermined time, and the threshold value can be calculated based thereon. According to the present control method, therefore, the threshold value can be corrected to the optimum threshold value conformed to the environmental change in the surroundings.

Figure 3:
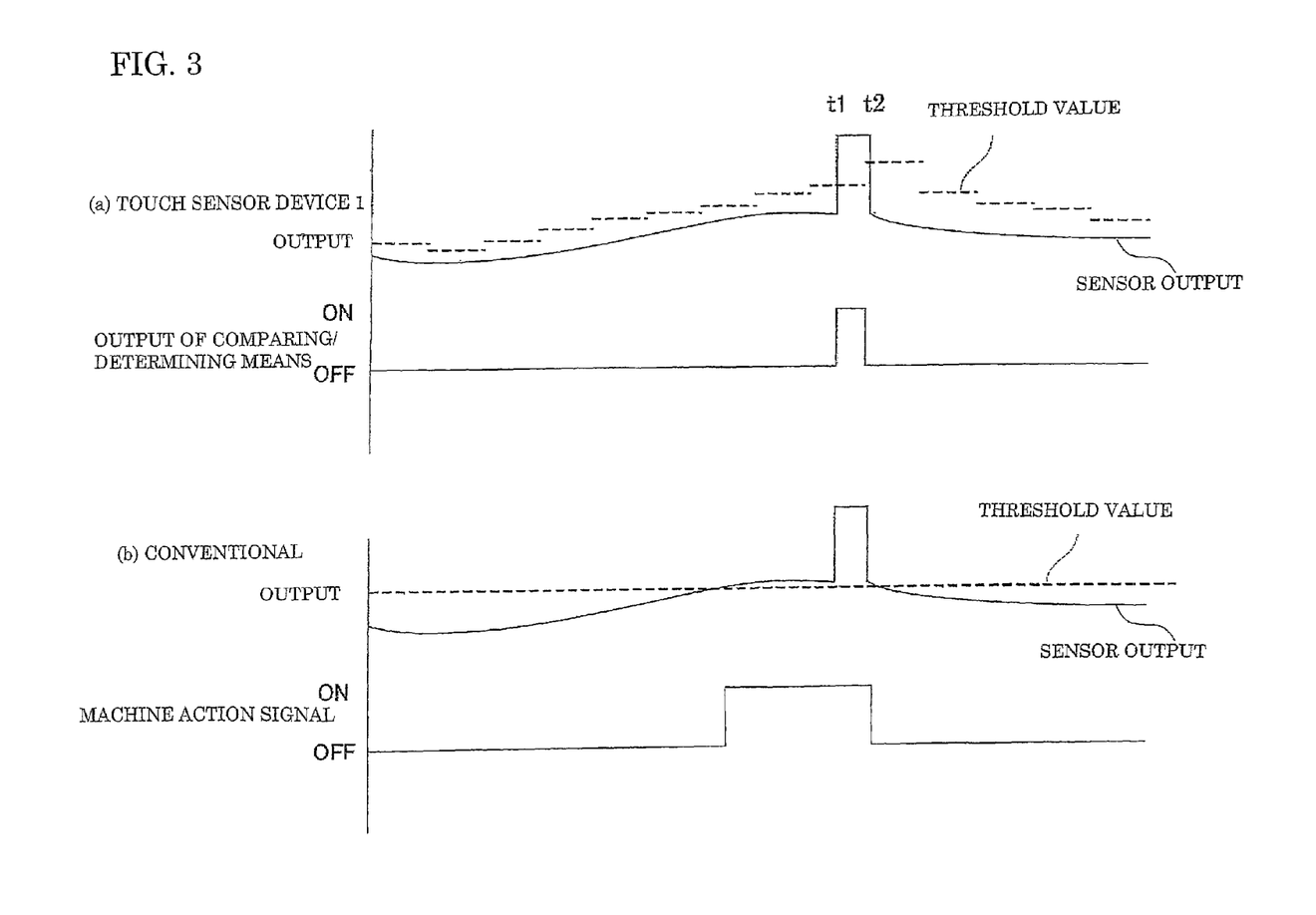
FIGS. 3(a) and 3(b) are timing charts for illustrating the actions of the touch sensor device 1 shown in FIG. 2.

FIG. 3(*a*) is a timing chart showing the operation of the touch sensor device according to the present invention. At the time t=0 to t1, there was no human contact, but the output voltage was unstable because of the environment surrounding the touch sensor device. At the time t=t1, human contact was made, so that the output from the touch sensor 11 increased sharply. At t1<t<t2, the output was constant. At t=t2, human contact was released (the human body left the touch sensor), whereupon the output decreased sharply. In this case, the average values were calculated periodically (t=0, n, 2n, . . . )

by the average value calculating means 12, and the threshold values were calculated based thereon. Thus, the threshold values were discrete values. At the time t1<t<t2 when the human contact action was performed, the output voltage exceeded the threshold value. Hence, the comparing/determining means 14 outputted the signal indicating the ON-action only at the time t1<t<t2.

With the conventional touch sensor device shown in FIG. 3(*b*), on the other hand, the threshold value was fixed. Even in the absence of human contact, therefore, the output voltage changed according to a change in temperature, becoming higher than the threshold value. As a result, malfunction occurred.

According to the present invention, as described above, even when the output voltage changes, for example, because of a change in the ambient temperature surrounding the touch sensor, the threshold value is corrected in response to the change in the output voltage. Thus, the touch sensor device, although of a simple configuration, can effectively prevent malfunction.

In the above configuration, if the human body as the dielectric has contacted the touch sensor since before the power to the touch sensor device is turned on, the output voltage from the touch sensor is high, starting at the power-on. Thus, the average value is high, and the threshold value also becomes high. Even when human contact is released once (for example, the hand is separated from the touch sensor), there may be a case where the threshold value does not lower until the next timing of threshold value calculation, and a malfunction occurs. The present invention may be configured to prevent this situation.

Figure 4:
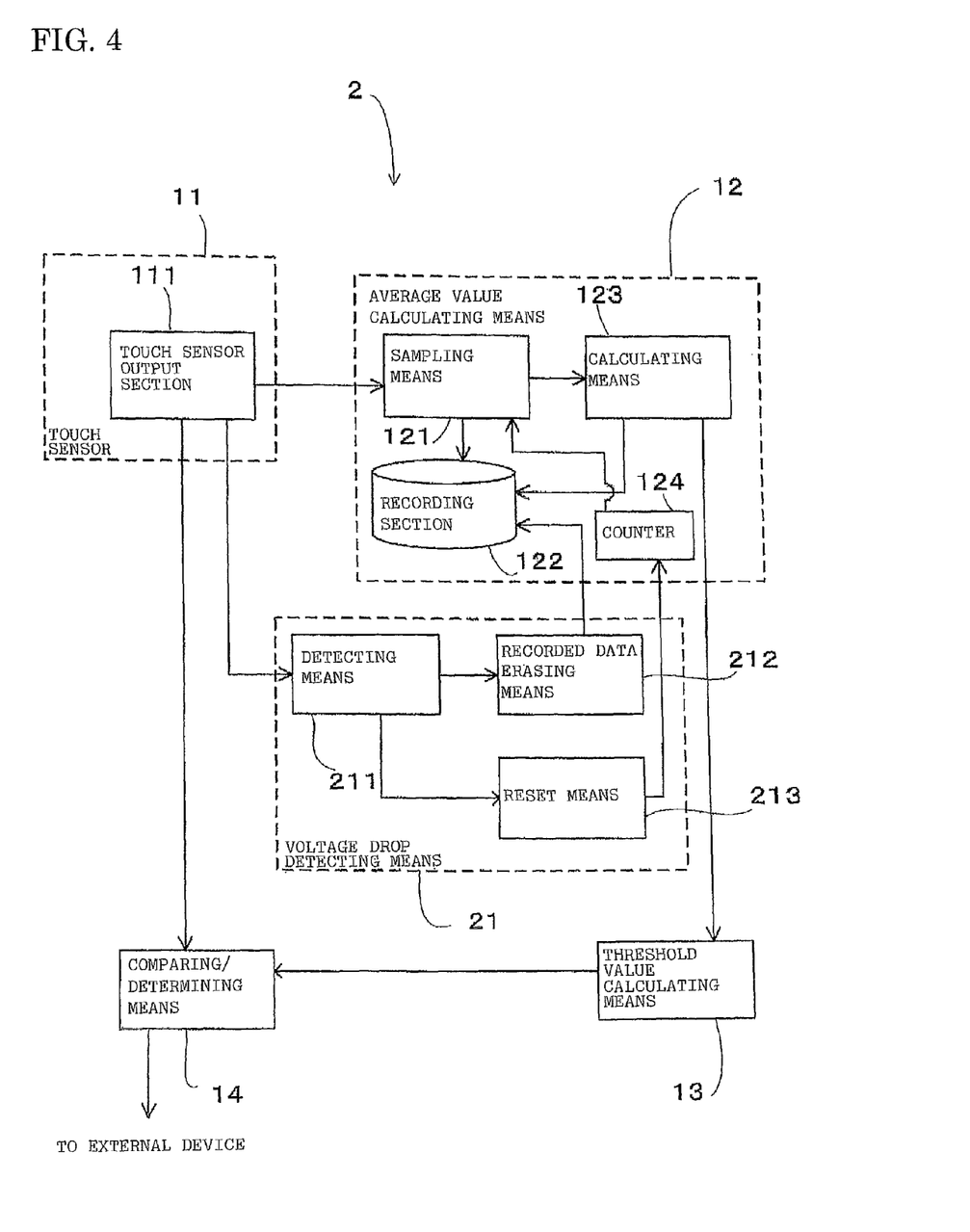
FIG. 4 is a block diagram for illustrating a touch sensor device 2 according to a second embodiment.

That is, as shown in FIG. 4, a touch sensor device 2 in a second embodiment is provided with a voltage drop detecting means 21 for detecting a drop in the output voltage of a touch sensor 11, and is adapted to reset the average value for calculating the threshold value immediately when a drop in the output voltage has been detected. FIG. 4 is a block diagram schematically showing the configuration of the touch sensor device 2 according to the second embodiment of the present invention.

The voltage drop detecting means 21, concretely, comprises a detecting means 211, and a recorded data erasing means 212 and a reset means 213 connected to the detecting means 211. The detecting means 211 is connected to an output section 111 of the touch sensor 11 so as to detect that the output voltage from the touch sensor 11 lowers, that is, detect a drop in the output voltage. Concretely, the detecting means 211 calculates changes in the output voltage from data on output voltages collected on a time basis, and outputs a signal indicating a voltage drop, if a minus change is found.

The recorded data erasing means 212 is also connected to a recording section 122 and, upon receipt of the signal indicating the voltage drop from the detecting means 211, erases all of the output voltage data recorded in the recording section 122. By so erasing the data in the recording section 122, it is possible to erase the output voltage data, which become the cause of a malfunction, the data existent up to a point in time when the signal indicating the voltage drop was inputted, for example, a point in time when human contact was released. From this point in time onwards, sampling can be started anew, and calculation of the moving average value of the output voltages can be begun. Thus, an appropriate threshold value can be calculated, and malfunction can be prevented.

The reset means 213 is also connected to a counter 124 for a sampling means 121 and, upon receipt of the signal indicating the voltage drop from the detecting means 211, resets the counter 124. That is, the counter 124 is set at t=0 again when the signal indicating the voltage drop is inputted from the detecting means 211. By so resetting the counter 124 in combination with the erasure of the data in the recording section 122, the moving average value of the output voltages can be calculated anew on a predetermined time basis. Thus, a more appropriate threshold value can be calculated, and malfunction can be prevented.

A control method for an external device with the use of the above-mentioned touch sensor device 2 will be described using FIG. 5. A flow chart illustrating the control method for the external device with the use of the touch sensor device 2 shown in FIG. 5 is different from the flowchart illustrating the control method using the touch sensor device 1 shown in FIG. 2 in that it has a voltage drop detection step S22, a recorded data erasure step S23, and a reset step S24.

Figure 5:
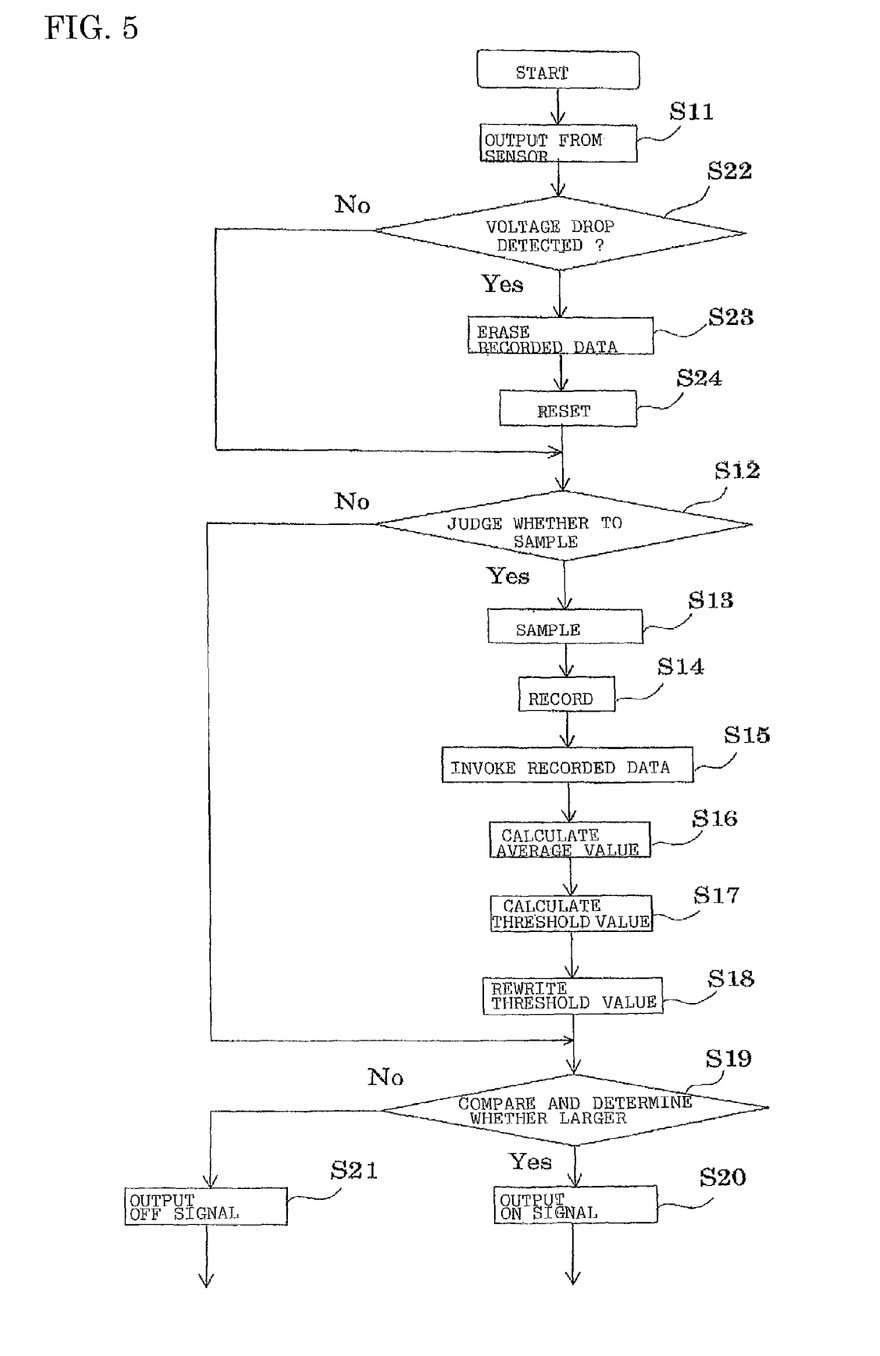
FIG. 5 is a flow chart for illustrating a control method according to the second embodiment.

In detail, according to the flowchart shown in FIG. 5, when the output voltage is outputted from the output section 111 of the touch sensor 11 (sensor output step: S11), it is judged by the detecting means 211 of the voltage drop detecting means 21 whether the output voltage has lowered, for example, upon release of human contact (judgment step: S22). When it is judged that the voltage has lowered, a signal indicating a drop in the voltage is sent out to the recorded data erasing means 212 and the reset means 213. As a result, data in the recording section 122 are erased by the recorded data erasing means 212 (recorded data erasure step: S23), and then the counter 124 is reset, and set again at the time t=0 (reset step: S24).

When the timing is rendered t=0 by the reset step, the time is judged to be the timing of sampling in the sampling judgment step (S12). Thus, the output voltage value is sampled, and the output voltage value as the average value is calculated by the calculating means 123 and sent out to the threshold value calculating means 13.

The threshold value is calculated by the threshold value calculating means 13 receiving the output voltage at the time of the voltage drop as the average value, and is outputted to the comparing/determining means 14. In the comparing/determining means 14, the output voltage from the touch sensor 11 is compared with the threshold value. If the output voltage is higher, a signal indicating an ON-action is outputted, and issued to the external device. If the output voltage is lower, a signal indicating an OFF-action is outputted.

If it is judged that the output voltage has not lowered, on the other hand, the output voltage is inputted, unchanged, to the sampling means 121, and the same steps as the aforementioned steps shown in FIG. 2 (S12 to S21) are performed.

In the present control method, as described above, in obtaining the threshold value conformed to the environmental change in the surroundings, it is detected whether the output voltage has lowered. If the signal indicating the decline in the output voltage is detected, data becoming the cause of a malfunction, which have been recorded in the recording section at this point in time, are erased, and the counter is reset. Consequently, a more appropriate threshold value can be obtained, and the malfunction of the touch sensor can be prevented.

Figure 6:
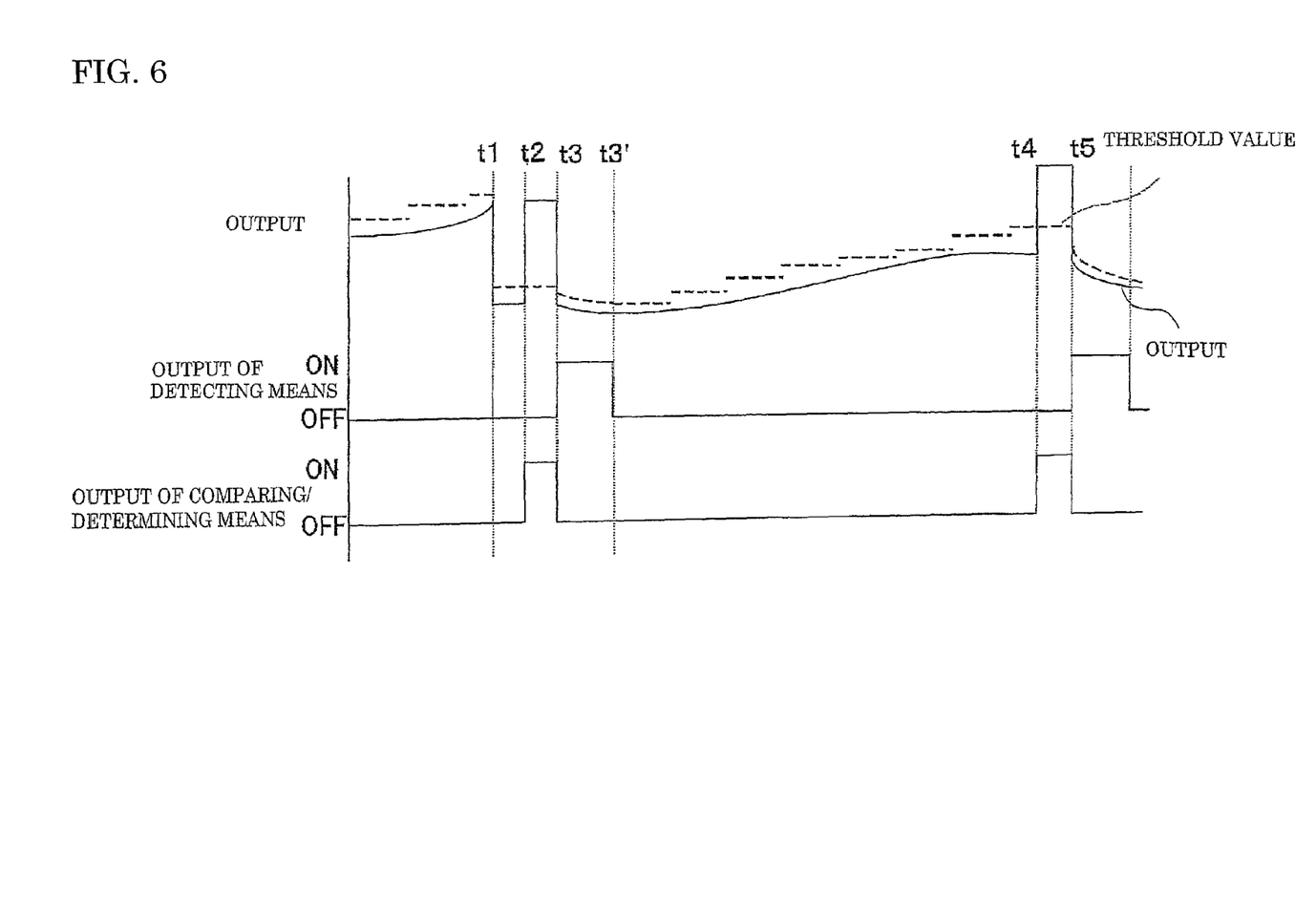
FIG. 6 is a timing chart for illustrating the actions of the touch sensor device 2 shown in FIG. 4.

FIG. 6 is a timing chart showing the operation of the touch sensor device 2 according to the second embodiment. At the time t 0<t<t1, the human body remained in contact, and the output voltage gradually changed. Then, at t=t1, human contact was released, and the output voltage sharply declined. Then, at the time t=t2, human contact was made, so that the output voltage from the touch sensor 11 increased sharply. At t2<t<t3, the output voltage was constant. At t=t3, the output voltage sharply lowered. Up to t=t3, the output voltage continued to lower. Thus, during this time zone t3≤t<t3', the output signal of the detecting means continued to be an output signal showing the decrease in the voltage. After t=t3, there was no human contact, the output voltage gradually increased, and the threshold value gradually increased accordingly. Then, at the time t=t4, there was human contact, so that the output voltage from the touch sensor 11 increased sharply. At t4<t<t5, the output voltage was constant. At t=t5, human contact was released, and the output voltage sharply declined.

The threshold value increased in correspondence with a slow increase during 0<t<t1 and t3'<t<t4. In the detecting means 211, on the other hand, the signals indicating the drop in the voltage were issued at the times t=t1, t3 to t3', and t5. Based on these signals, data in the recording section 122 were erased, and the counter 124 was reset, at these times. Thus, the threshold values were newly calculated at the points in time of t=t1, t3 to t3', and t5.

At the times t2<t<t3 and t4<t<t5 when the human contact action was performed, the output voltage exceeded the threshold value. Thus, the comparing/determining means 14 outputted the signals indicating the ON-action only at the times t=t2<t<t3 and t=t4<t<t5.

According to the touch sensor device 2, as described above, even if the output voltage from the touch sensor has kept high since the time of the power-on, upon release of contact of the human body as the dielectric (for example, detachment of the hand from the touch sensor), data recorded up to this point in time are erased, and the counter is also reset. At that point in time, the threshold value is corrected, and the occurrence of a malfunction can be prevented.

The above touch sensor device 1, and the touch panel device equipped with the touch sensor device 2, the panel section, and the control section, namely, the touch panel device in which the contact electrode as the input section of the touch sensor is provided in the panel section, and the comparing/determining means 14 is connected to the control section, can prevent a malfunction, and can also prevent a cost increase.

The above control methods can all be executed as programs in a computer. In this case, the touch panel device can be configured to provide the contact electrode, as the input section of the touch sensor, in the panel section, and carry out the control method by the computer provided in the touch panel device itself. By so doing, a cost increase can be prevented.

INDUSTRIAL APPLICABILITY

The present touch sensor device can be used as a touch sensor device in organic EL sheets, touch panels (e.g., display panels of equipment and switches for audio products installed on automobiles), etc. Thus, the present touch sensor device can be utilized in the field of industrial equipment.

The invention claimed is:

1. A touch sensor device, comprising:
   a touch sensor;
   average value calculating means for calculating an average value of output voltages sent out from an output section of the touch sensor;
   threshold value calculating means for calculating a threshold value based on the average value;
   comparing/determining means for comparing the output voltage with the threshold value and, when determining that the output voltage exceeds the threshold value, outputting a determination signal; wherein
   the average value calculating means comprises
   sampling means for sampling the output voltages periodically, and recording the sampled output voltages as output voltage data in a recording section, and
   calculating means for calculating a moving average value of the output voltages recorded in the recording section, and sending out the calculated moving average value to the threshold value calculating means, and
   voltage drop detecting means connected to the output section,
   wherein the voltage drop detecting means includes,
   detecting means for outputting a signal indicating a drop in the voltage when detecting that the output voltage has dropped, and
   recorded data erasing means for erasing the output voltage data in the recording section in accordance with the signal indicating the drop in the voltage.

2. The touch sensor device according to claim 1, wherein the voltage drop detecting means has reset means connected to the detecting means, and
   in accordance with the signal indicating the drop in the voltage, the reset means resets a counter provided for the sampling means.

3. A touch panel device, comprising:
   the touch sensor device according to claim 1,
   a panel section; and
   a control section, wherein
   a contact electrode as an input section of the touch sensor device is provided in the panel section, and
   the comparing/determining means is connected to the control section.

4. A control method using a touch sensor, comprising:
   an average value calculation step of calculating an average value of output voltages from an output section of the touch sensor;
   a threshold value calculation step for calculating a threshold value from the calculated average value;
   a comparison/determination step for comparing the output voltage with the threshold value and, when determining that the output voltage exceeds the threshold value, sending out a determination signal for deciding on an ON-action of a device;
   a judgment step of outputting a signal indicating a drop in the output voltage when detecting from the output section that the output voltage has dropped, and
   a recorded data erasure step of erasing output voltage data recorded in a recording section when the signal indicating the drop in the output voltage has been outputted.

5. The control method using a touch sensor according to claim 4, wherein
   the average value calculation step comprises
   a sampling step of sampling the output voltages periodically, and recording the sampled output voltages as output voltage data in a recording section, and
   a calculation step of calculating a moving average value of the recorded output voltages.

6. The control method using a touch sensor according to claim 4, wherein
   when the signal indicating the drop in the output voltage has been outputted, the counter of the sampling means is reset.

7. A non-transitory computer-readable storage medium storing a program that causes a computer to execute the steps of:
   the control method using a touch sensor according to claim 4.

* * * * *